United States Patent
Su et al.

(10) Patent No.: US 8,422,620 B2
(45) Date of Patent: Apr. 16, 2013

(54) SHIFT REGISTERS

(75) Inventors: Kuo-Chang Su, Hsinchu (TW);
Tsung-Ting Tsai, Hsinchu (TW);
Yung-Chih Chen, Hsinchu (TW);
Chun-Hsin Liu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 461 days.

(21) Appl. No.: 12/607,156

(22) Filed: Oct. 28, 2009

(65) Prior Publication Data
US 2011/0002437 A1    Jan. 6, 2011

(30) Foreign Application Priority Data
Jul. 1, 2009   (TW) ................................ 98122209 A

(51) Int. Cl.
*G11C 19/00* (2006.01)

(52) U.S. Cl.
USPC .................... 377/64; 377/68; 377/78; 377/79

(58) Field of Classification Search ......................... None
See application file for complete search history.

(56) References Cited

U.S. PATENT DOCUMENTS

| 6,970,530 | B1* | 11/2005 | Wang et al. ...................... 377/69 |
| 7,317,780 | B2* | 1/2008 | Lin et al. .......................... 377/67 |
| 7,400,698 | B2* | 7/2008 | Chang et al. ..................... 377/64 |
| 7,436,923 | B2* | 10/2008 | Tobita .............................. 377/64 |
| 7,817,771 | B2* | 10/2010 | Tsai et al. ........................ 377/64 |
| 2007/0274433 | A1* | 11/2007 | Tobita .............................. 377/64 |
| 2007/0297559 | A1* | 12/2007 | Cho et al. ........................ 377/64 |
| 2009/0304138 | A1* | 12/2009 | Tsai et al. ........................ 377/79 |

* cited by examiner

*Primary Examiner* — Tuan T Lam
(74) *Attorney, Agent, or Firm* — McClure, Qualey & Rodack, LLP

(57) ABSTRACT

A shift register is provided and includes a first shift registering unit and a second shift registering unit. The first shift registering unit generates a first trigger signal at a first output terminal and includes a first pull-down circuit. The second shift registering unit receives the first trigger signal and generates a second trigger signal at a second output terminal. The first trigger signal and the second trigger signal are sequentially asserted. The second shift registering unit includes a second pull-down circuit. The first pull-down circuit and the second pull-down circuit perform pull-down operations at different times. When the first pull-down circuit does not perform the pull-down operation, the second pull-down circuit performs pull-down operations to the first output terminal.

20 Claims, 7 Drawing Sheets

SHIFT REGISTERS

CROSS REFERENCE TO RELATED APPLICATIONS

This application claims the benefit of Taiwan application Serial No. 98122209 filed Jul. 1, 2009, the subject matter of which is incorporated herein by reference.

BACKGROUND OF THE INVENTION

1. Field of the Invention

The invention relates to a shift register, and more particularly to a shift register in which each shift registering unit has only one pull-down circuit, and the pull-down circuits in one set of adjacent shift registering units alternately operate.

2. Description of the Related Art

FIGS. 1A-1B show a conventional shift register. Referring to FIGS. 1A-1B, a shift register 1 comprises a plurality of stages of shift registering units. In FIGS. 1A-1B, six stages of shift registering units $1_1$-$1_6$ are given as an example. The shift registering units have the same circuitry structure, for example, one shift registering unit $1_1$ comprises a pull-up control circuit 10, a pull-up circuit 11, and two pull-down circuits 12 and 13. Each shift registering unit receives a trigger signal and generates an output signals. Except for the last-stage shift registering unit $1_6$, the other shift registering units $1_1$-$1_5$ generate output signals $OUT_1$-$OUT_5$ to serve as the trigger signals of the next shift registering units, respectively. The first-stage shift registering unit $1_1$ receives a signal TS which is externally input thereto. The shift registering unit $1_6$ generates an output signal $OUT_6$ to serve as a trigger signal for following circuits.

Referring to FIGS. 1A-1B, to achieve a shift-registering operation, the pull-up circuits 11 in the odd-stage shift registering units $1_1$, $1_3$, and $1_5$ are controlled by a clock signal CK1, while the pull-up circuits 11 in the even-stage shift registering units $1_2$, $1_4$, and $1_6$ are controlled by an inverse signal of the clock signal CK1; that is, a clock signal XCK1. Moreover, in the odd-stage shift registering units $1_1$, $1_3$, and $1_5$, the pull-down circuits 12 are controlled by a clock signal CK2, while the pull-down circuits 13 are controlled by an inverse signal of the clock signal CK2; that is, a clock signal XCK2. In the even-stage shift registering units $1_2$, $1_4$, and $1_6$, the pull-down circuits 12 are controlled by the clock signal XCK2, while the pull-down circuits 13 are controlled by the clock signal CK2. For each shift registering unit, the pull-down circuits 12 and 13 alternately operate according to the clock signals CK2 and XCK2, which are inverse to each other, for performing a pull-down operation to nodes in the shift registering unit.

However, two pull-down circuits occupy a large area for one shift registering unit having limited circuitry space. Each shift registering unit further uses a large amount of thin film transistors (TFTs), which affects power consumption of the shift register.

Thus, it is desirable to provide a shift register which can simplify pull-down circuits in shift registering units, to allow for flexible circuitry design layouts, while effectively decreasing power consumption.

BRIEF SUMMARY OF THE INVENTION

An exemplary embodiment of a shift register comprises a first shift registering unit and a second shift registering unit. The first shift registering unit generates a first trigger signal at a first output terminal and comprises a first pull-down circuit. The second shift registering unit receives the first trigger signal and generates a second trigger signal at a second output terminal. The first trigger signal and the second trigger signal are sequentially asserted. The second shift registering unit comprises a second pull-down circuit. The first pull-down circuit and the second pull-down circuit perform pull-down operations at different times. When the first pull-down circuit does not perform the pull-down operation, the second pull-down circuit performs pull-down operations to the first output terminal.

In some embodiments, the shift register further comprises a third shift registering unit. The third shift registering unit receives the second trigger signal and generates a third trigger signal at a third output terminal. The first trigger signal, the second trigger signal, and the third trigger signal are sequentially asserted. The third shift registering unit comprises a third pull-down circuit. The first and third pull-down circuits simultaneously perform and not perform pull-down operations.

In some embodiments, the shift register further comprises a fourth shift registering unit. The fourth shift registering unit receives the third trigger signal and generates a fourth trigger signal at a fourth output terminal. The first trigger signal, the second trigger signal, the third trigger signal, and fourth trigger signal are sequentially asserted. The fourth shift registering unit comprises a fourth pull-down circuit. The second and fourth pull-down circuits simultaneously perform and do not perform pull-down operations.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Shift registers are provided. In an exemplary embodiment of a shift register in FIGS. 2A-2B, a shift register 2 comprises a plurality of stages of shift registering units. In the embodiment, six shift registering units $2_1$-$2_6$ are given as an example for clear description. In practice, the number of the shift registering units is determined according to system requirements.

Figure 1A:
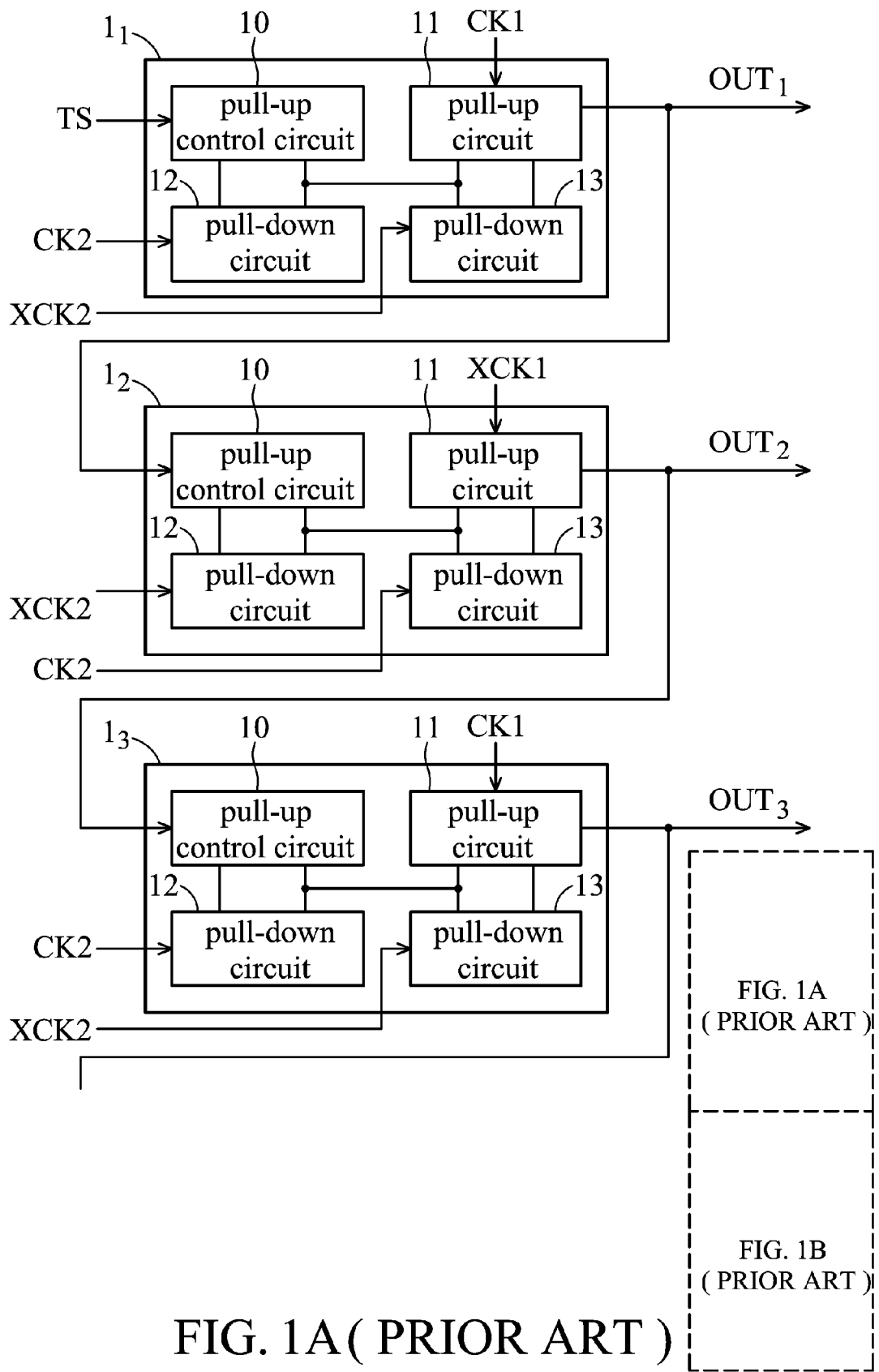
FIGS. 1A-1B show a conventional shift register.
Figure 1B:
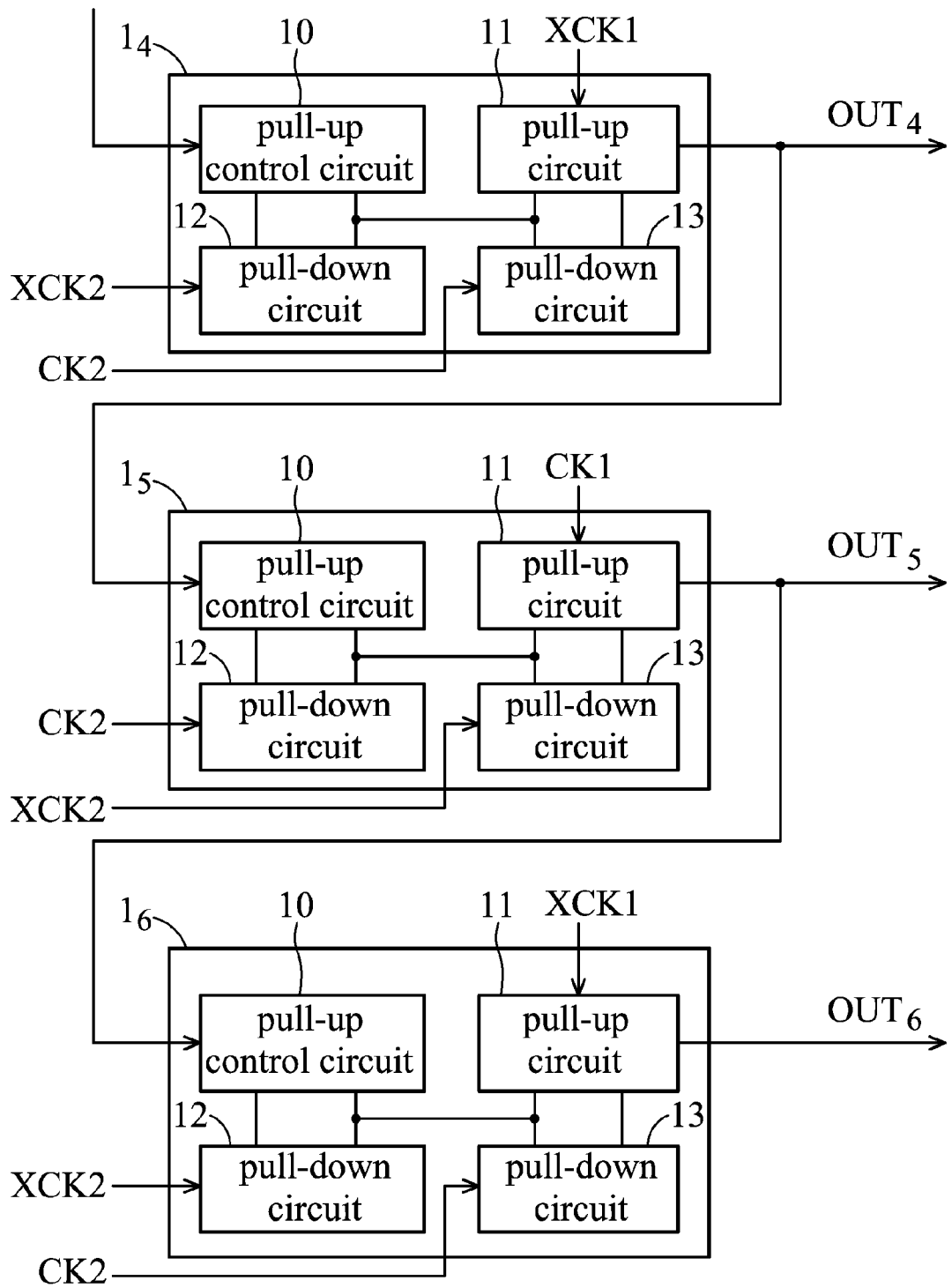
Figure 2A:
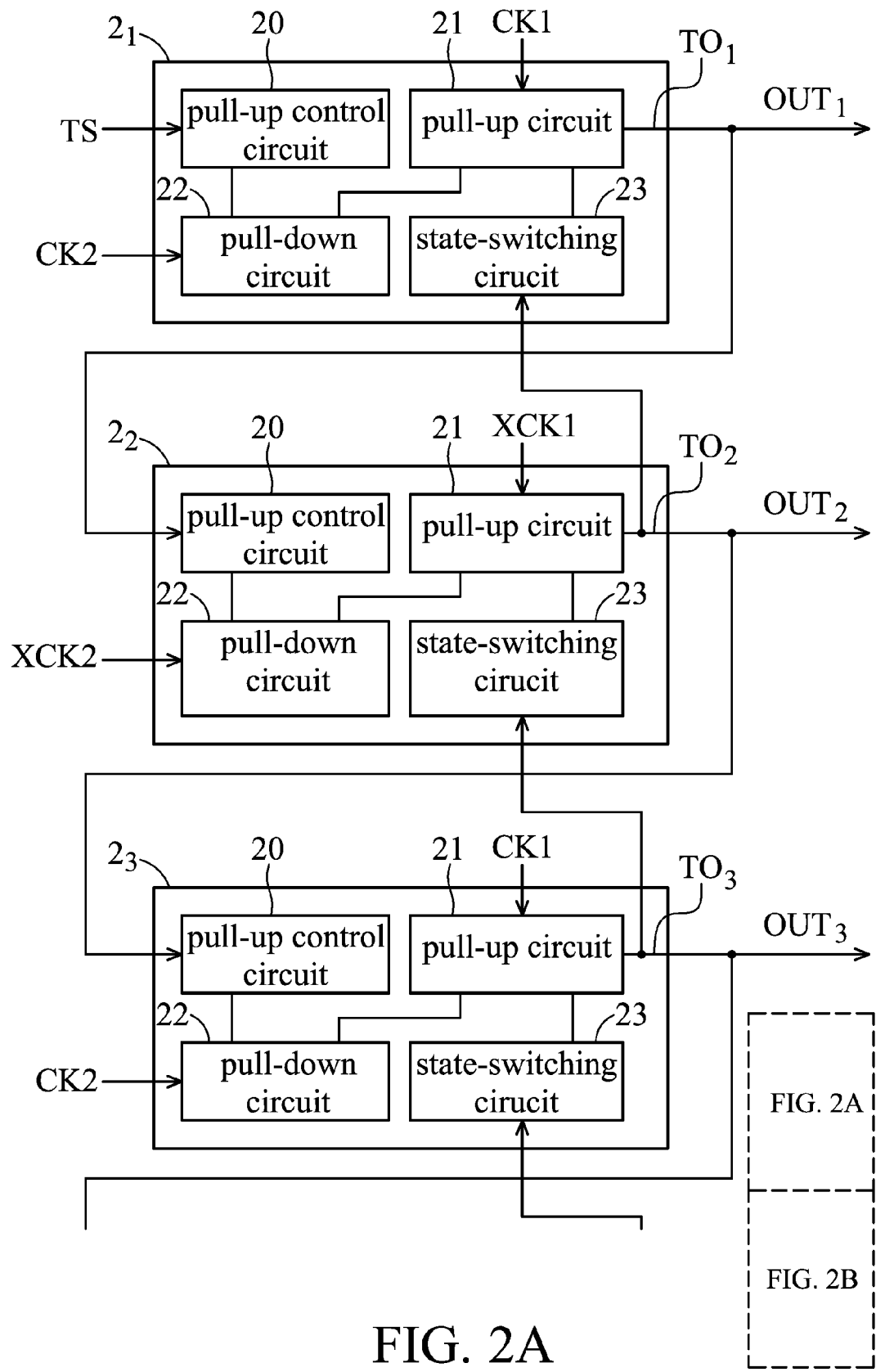
FIGS. 2A-2B show an exemplary embodiment of a shift register.
Figure 2B:
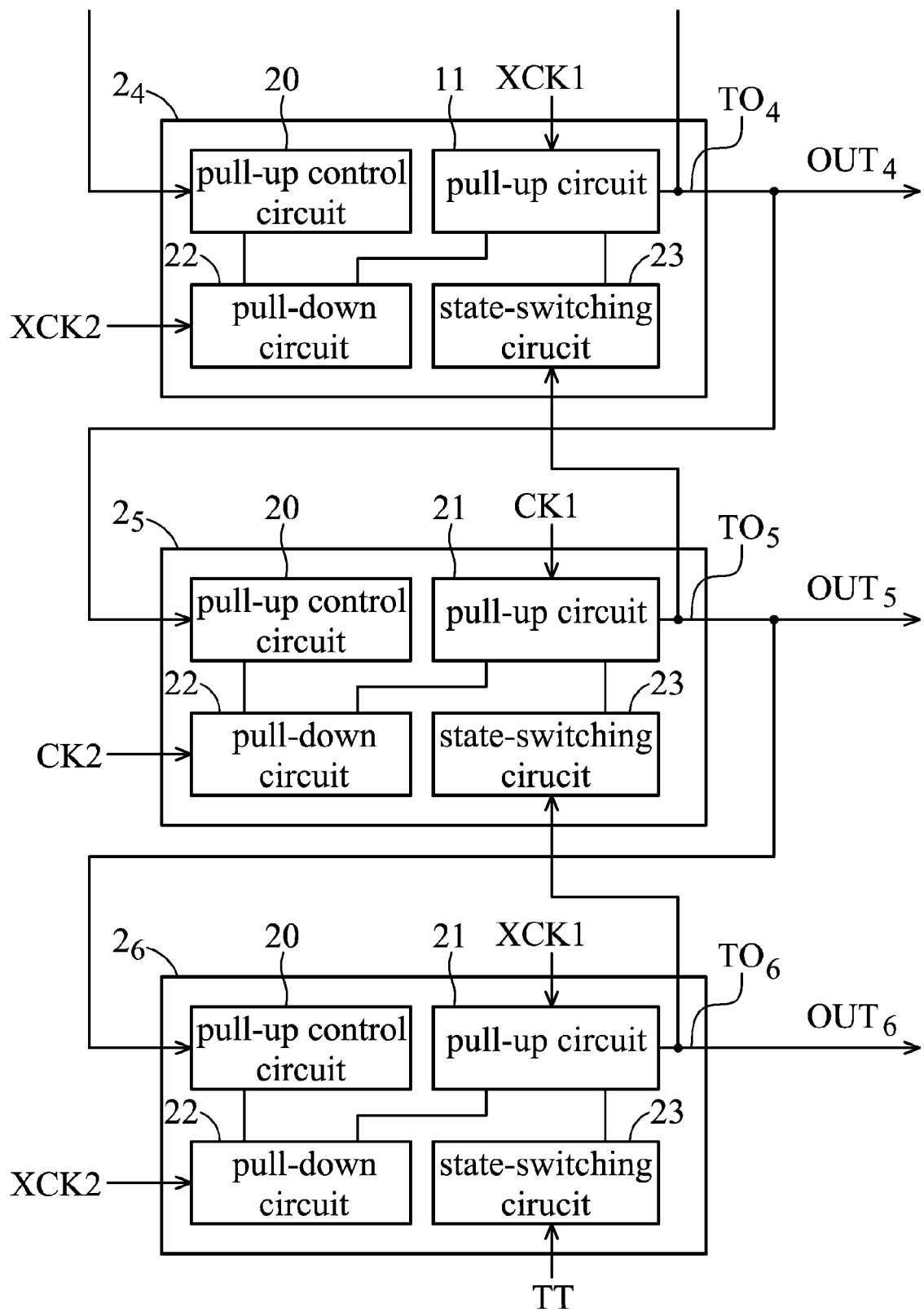

Referring to FIGS. 2A-2B, the shift register 2 comprises six shift registering units $2_1$-$2_6$. The shift registering units $2_1$-$2_6$ have the same circuitry structure. For example, the shift registering unit $2_1$ comprises a pull-up control circuit 20, a pull-up circuit 21, a single pull-down circuit 22, and a state-switching circuit 23. Each shift registering unit receives a trigger signal and generates an output signal at a respective output terminal. Except for the last-stage shift registering unit $2_6$, the other shift registering units $2_1$-$2_5$ generates output signals $OUT_1$-$OUT_5$ at output terminals $TO_1$-$TO_5$ to serve the trigger signals of the next shift registering units $2_2$-$2_6$, respectively. The first-stage shift registering unit $2_1$ receives a signal TS which is input external to serve as its trigger signal. The last-stage shift registering unit $2_6$ generates the output signal $OUT_6$ at the output terminal $TO_6$ to serve as a trigger signal for following circuits. The output signals $OUT_1$-$OUT_6$ are sequentially asserted. Thus, the trigger signals received by the shift registering units $2_2$-$2_6$ and the following circuits are sequentially asserted.

Figure 5:
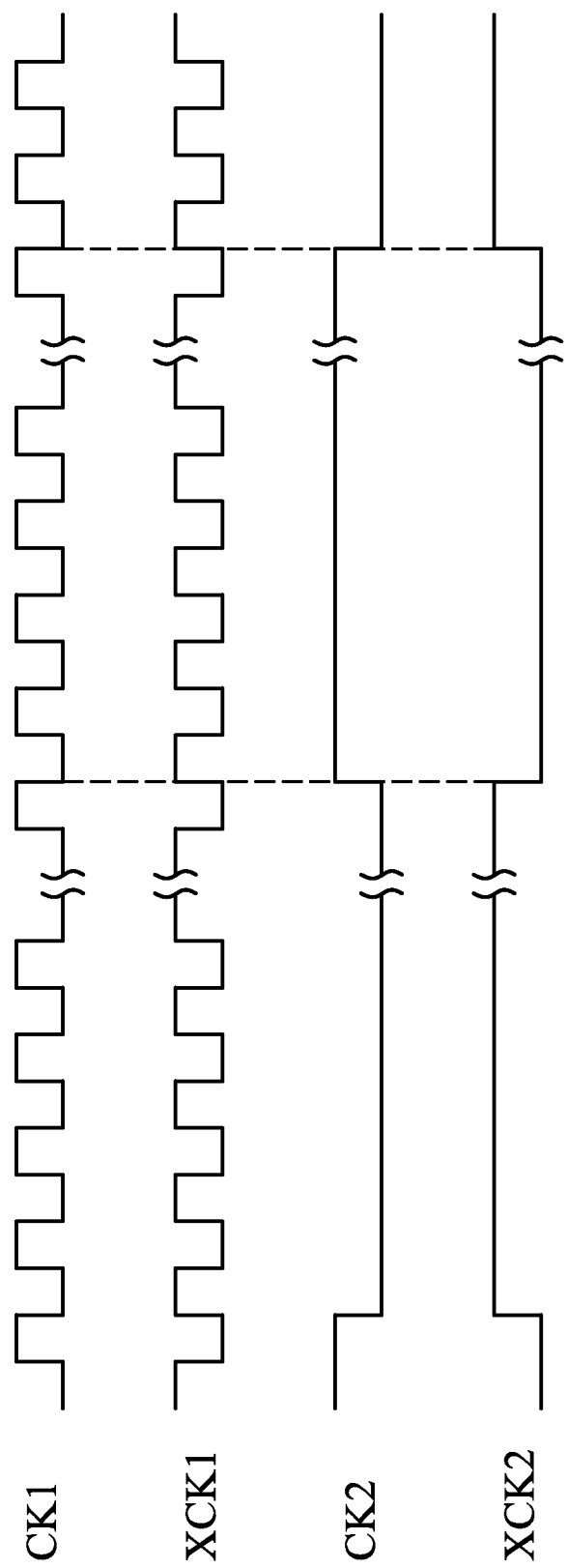
FIG. 5 shows clock signals of the shift register in FIG. 2.

Referring to FIGS. 2A-2B, to achieve a shift-registering operation, the pull-up circuits 21 in the odd-stage shift registering units $2_1$, $2_3$, and $2_5$ are controlled by a clock signal CK1, while the pull-up circuit 21 in the even-stage shift registering units $2_2$, $2_4$, and $2_6$ are controlled by an inverse signal of the clock signal CK1; that is, clock signal XCK1. Moreover, in the odd-stage shift registering units $2_1$, $2_3$, and $2_5$, the pull-down circuits 22 are controlled by a clock signal CK2, and in the even-stage shift registering units $2_2$, $2_4$, and $2_6$, the pull-down circuits 22 are controlled by an inverse signal of the clock signal CK2; that is, a clock signal XCK2. Thus, the pull-down circuits 22 of the odd-stage shift registering units $2_1$, $2_3$, and $2_5$ and the pull-down circuits 22 of the even-stage shift registering units $2_2$, $2_4$, and $2_6$ alternately perform pull-down operations. In the embodiment, the frequencies of the clock signals CK2 and XCK2 are lower than frequencies of the clock signals CK1 and XCK1, as shown in FIG. 5.

For example, when the pull-down circuits 22 of the even-stage shift registering units $2_2$, $2_4$, and $2_6$ perform pull-down operations according to the clock signal XCK2, the pull-down circuits 22 of the odd-stage shift registering units $2_1$, $2_3$, and $2_5$ do not perform pull-down operations according to the clock signal CK2. At this time, the pull-down circuits 22 of the even-stage shift registering units $2_2$, $2_4$, and $2_6$ respectively perform pull-down operations to the output terminals $TO_2$, $TO_4$, and $TO_6$, and to the output terminals $TO_1$, $TO_3$, and $TO_5$ of the odd-stage shift registering units $2_1$, $2_3$, and $2_5$.

Contrarily, when the pull-down circuits 22 of the odd-stage shift registering units $2_1$, $2_3$, and $2_5$ perform pull-down operations according to the clock signal CK2, the pull-down circuits 22 of the even-stage shift registering units $2_2$, $2_4$, and $2_6$ do not perform pull-down operations according to the clock signal XCK2. At this time, the pull-down circuits 22 of the odd-stage shift registering units $2_3$, and $2_5$ respectively perform pull-down operations to the output terminals $TO_3$, and $TO_5$, and to the output terminals $TO_2$ and $TO_4$ of the odd-stage shift registering units $2_2$ and $2_4$. In the embodiment, an external circuit can be used to perform pull-down operations to the output terminal $TO_6$ of the shift registering unit $2_6$. As described above, in the shift register 2, the pull-down operation to the output terminal of the shift registering unit in which the pull-down circuit is not performing pull-down operations is performed by the pull-down circuit of the next shift registering unit.

Referring to FIGS. 2A-2B, the state-switching circuit 23 of each shift registering unit is coupled to the corresponding output terminal and receives the output signal generated by the next shift registering unit. For example, the state-switching circuit 23 of the shift registering unit $2_1$ receives the output signal $OUT_2$ generated by the next shift registering unit $2_2$, so that the output signal $OUT_1$ is switched to a de-asserted state when the output signal $OUT_2$ is asserted. The state-switching circuit 23 of the shift registering unit $2_6$ receives an external signal TT.

Figure 3:
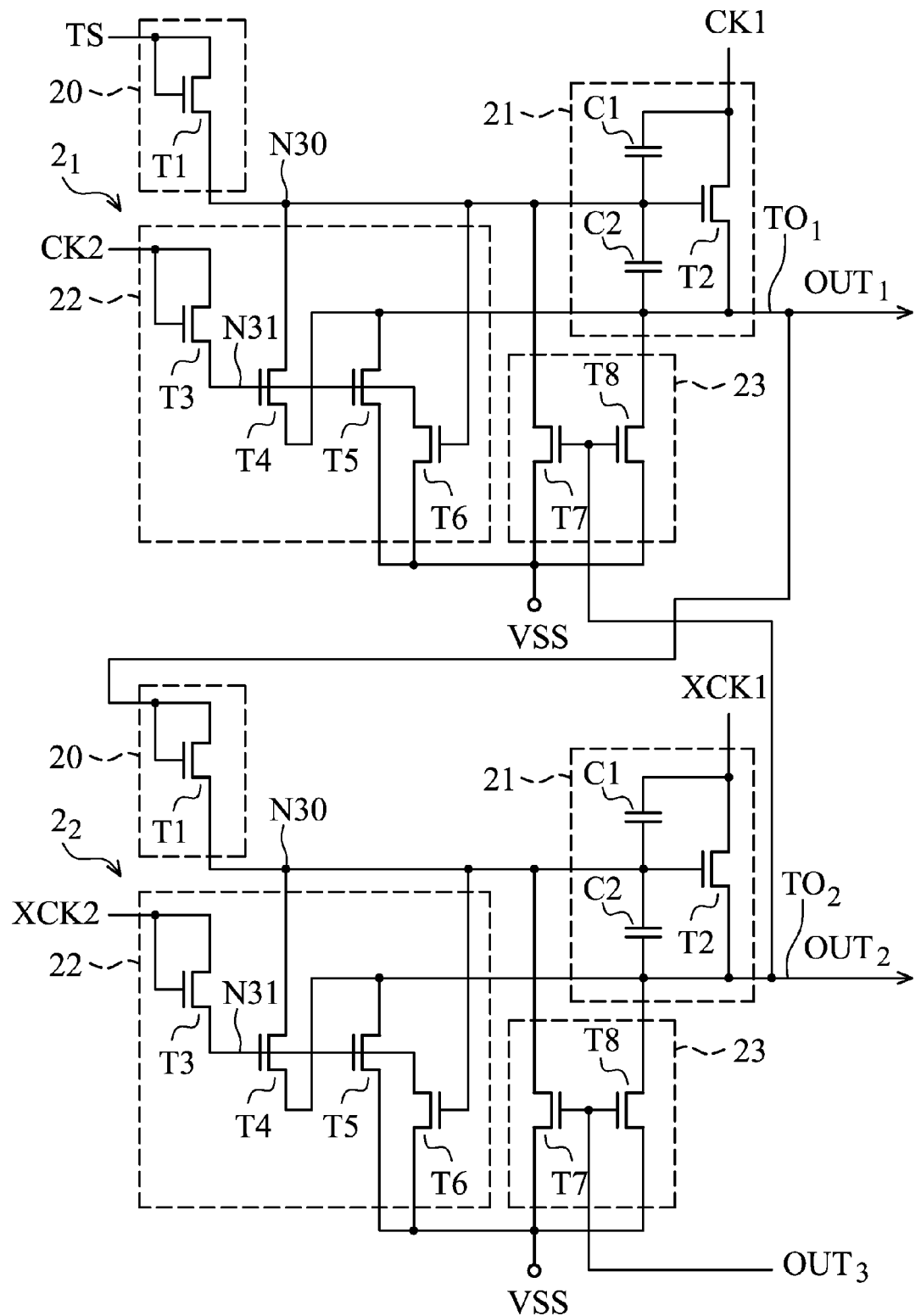
FIG. 3 shows detailed circuitry of the shift register in FIGS. 2A-2B.

The detailed circuitry of each shift registering unit will be described in the following. For clarity, FIG. 3 only shows the detailed circuitry of the shift registering units $2_1$-$2_2$. The shift registering units $2_1$-$2_2$ have the same circuitry, so only the shift registering unit $2_1$ is given as an example for detailed description. Referring to FIG. 3, the pull-up control circuit 20 of the shift registering unit $2_1$ comprises a transistor T1. An input terminal and a control terminal of the transistor T1 are coupled together and receive a trigger signal, and an output terminal thereof is coupled to a node N30. Note that the trigger signal received by the transistor T1 of the shift registering unit $2_1$ is the signal TS which is externally input thereto. The trigger signals received by the transistors T1 of the other shift registering units $2_2$-$2_6$ are the output signals $OUT_1$-$OUT_5$ which are generated respectively by previous shift registering units $2_1$-$2_5$.

The pull-up circuit 21 of the shift registering unit $2_1$ comprises a transistor T2 and capacitors C1 and C2. A control terminal of the transistor T2 is coupled to the node N30, an input terminal thereof receives the corresponding clock signal CK1, and an output terminal thereof is coupled to the corresponding output terminal $TO_1$. The capacitor C1 is coupled between the control terminal and the input terminal of the transistor T2, and the capacitor C2 is coupled between the control terminal of the transistor T2 and the output terminal $TO_1$. The output terminal $TO_1$ is coupled to the control terminal of the transistor T1 of the next shift registering unit $2_2$. Referring to FIG. 3, in the odd-stage shift registering units $2_1$, $2_3$, and $2_5$, the input terminals of the transistors T2 receive the clock signal CK1; in the even-stage shift registering units $2_2$, $2_4$, and $2_6$, the input terminals of the transistors T2 receive the clock signal XCK1. The pull-up circuits 21 of the shift registering units $2_1$-$2_5$ generate the output signals $OUT_1$-$OUT_6$ at the output terminals $TO_1$-$TO_5$ to serve as the trigger signals received by the shift registering units $2_2$-$2_6$, respectively.

The pull-down circuit 22 of the shift registering unit $2_1$ comprises transistors T3-T6. Referring to FIG. 3, a control terminal and an input terminal of the transistor T3 receive the corresponding clock signal CK2. According to the embodiment, in the odd-stage shift registering units $2_1$, $2_3$, and $2_5$, the control terminals and the input terminals of the transistors T3 receive the clock signal CK2; in the even-stage shift registering units $2_2$, $2_4$, and $2_6$, the control terminals and the input terminals of the transistors T3 receive the clock signal XCK2. A control terminal of the transistor T4 is coupled to an output terminal of the transistor T3 at a node N31, an input terminal thereof is coupled to the node N30, and an output terminal thereof is coupled to the corresponding output terminal $TO_1$. A control terminal of the transistor T5 is coupled to the node N31, an input terminal thereof is coupled to the corresponding output terminal $TO_1$, and an output terminal thereof is coupled to a reference voltage source VSS. A control terminal of the transistor T6 is coupled to the node N30, an input terminal thereof is coupled to the node N31, and an output terminal is coupled to the reference voltage source VSS. In the embodiment, the size of the transistor T6 is larger than the size of the transistor T3.

The stage-switching circuit 23 of the shift registering unit $2_1$ comprises transistors T7 and T8. A control terminal of the transistor T7 receives the output signal $OUT_2$ generated by the next shift registering unit $2_2$, an input terminal thereof is coupled to the node N30, and an output terminal thereof is coupled to the reference voltage source VSS. A control terminal of the transistor T8 receives the output signal $OUT_2$, an input terminal thereof is coupled to the output terminal $TO_1$, and an output terminal thereof is coupled to the reference voltage source VSS.

Figure 4:
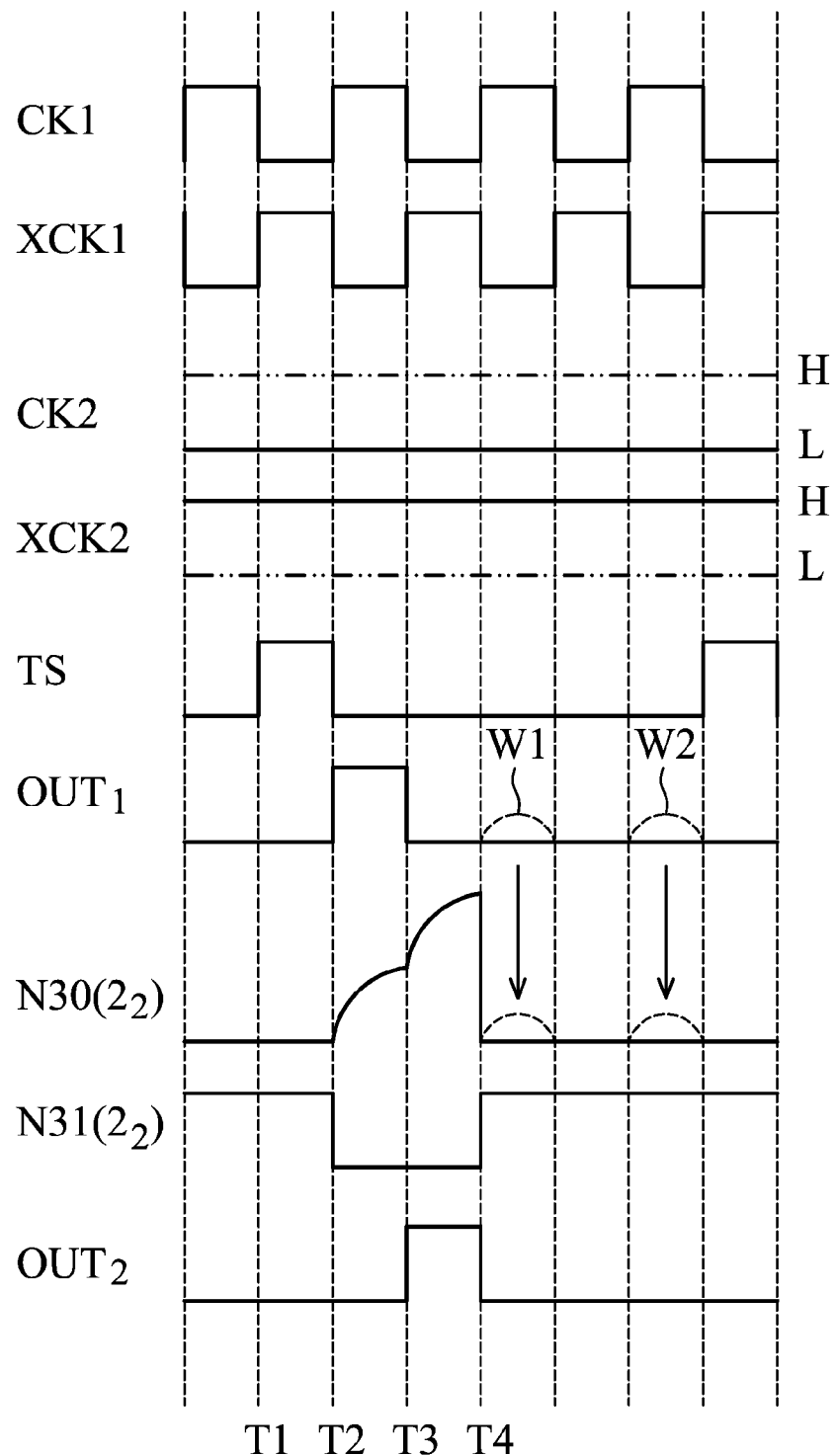
FIG. 4 is a timing chart of the shift registering units in FIG. 3.

FIG. 4 is a timing chart of the shift registering units in FIG. 3. The shift registering units $2_1$ and $2_2$ are given as an example to describe operations of the shift registering units by referring to FIGS. 3 and 4. Assume that the pull-down circuits 22 of the even-stage shift registering units $2_2$, $2_4$, and $2_6$ perform pull-down operations according to the clock signal XCK2 with a high level (H), while the pull-down circuits 22 of the odd-stage shift registering units $2_1$, $2_3$, and $2_5$ do not perform pull-down operations according to the clock signal CK2 with a low level (L).

During a period between time points T1-T2, the transistor T1 of the shift registering unit $2_1$ is turned on by the signal TS with a high level, and the voltage of the node N30 is at the high level to turn on the transistor T2. Since the transistor T2 receives the clock signal CK1 with a low level, the output signal $OUT_1$ at the output terminal $TO_1$ is at a low level.

During a period between time points T2-T3, due to the storage of the capacitor C1 of the shift registering unit $2_1$, the voltage of the node N30 is still at the high level to turn on the transistor T2. At this time, the clock signal CK1 is switched to a high level, so that the output signal $OUT_1$ at the output terminal $TO_1$ switches to a high level. Moreover, since the output signal $OUT_1$ serves as the trigger received by the shift registering unit $2_2$, the transistor T1 of the shift registering unit $2_2$ is turned on according to the output signal $OUT_1$ with the high level. The voltage of the node N30 of the shift registering unit $2_2$ is at the high level to turn on the transistor T2 of the shift registering unit $2_2$. Since the transistor T2 of the shift registering unit $2_2$ receives the clock signal XCK1 with the low level, the output signal $OUT_2$ at the output terminal $TO_2$ is at a low level.

During a period between time points T3-T4, due to the storage of the capacitors C1 and C2 of the shift registering unit $2_2$, the voltage of the node N30 of the shift registering unit $2_2$ is still at the high level to turn on the transistor T2 of the shift registering unit $2_2$. At this time, the clock signal XCK1 is switched to the high level, so that the output signal $OUT_2$ at the output terminal $TO_2$ switches to a high level. Moreover, due to the output signal $OUT_2$ with the high level, the transistors T7 and T8 of the shift registering unit $2_1$ are turned on, and the output signal $OUT_1$ at the output terminal $TO_1$ switches to a low level (that is the output signal $OUT_1$ is at a de-assertion state).

During the period between the time points T2-T4, the voltage of the node N30 of the shift registering unit $2_2$ is at the high level, so that the transistor T6 of the shift registering unit $2_2$ is turned on. The transistor T3 of the shift registering unit $2_2$ is turned on by the clock signal XCK2 with the high level. As described above, the size of the transistor T6 is larger than the size of the transistor T3. Thus, the voltage of the node N31 is at a low level to turn off the transistors T4 and T5, so that the output signal $OUT_2$ generated by the shift registering unit $2_2$ is transmitted to the next shift registering unit $2_3$ to serve as the trigger signal of the shift registering unit $2_3$.

In time periods excluding the period between the time points T2-T4, the clock signal CK1 is periodically switched between the high level and the low level. When the clock signal CK1 is at the high level, an overshoot wave, represented by W1 or W2, is induced by coupling the clock signal CK1 to the output terminal $TO_1$ through the capacitors C1 and C2 of the shift registering unit $2_1$. The overshoot wave W1/W2 is then transferred to the node N30 of the shift registering unit $2_2$ by the coupling of the parasitic capacitor of the transistor T1 of the shift registering unit $2_2$. In the embodiment, the level of the overshoot wave W1/W2 is too low to turn on the transistor T6 of the shift registering unit $2_2$. At this time, the transistor T3 shift registering unit $2_2$ is turned on according to the clock signal XCK2 with the high level, so that the voltage of the node N31 of the shift registering unit $2_2$ is at a high level to turn on the transistors T4 and T5 of the shift registering unit $2_2$. Thus, the output signal $OUT_1$ at the output terminal $TO_2$ and the voltage of the node N30 of the shift registering unit $2_2$ are pulled down to the level of the reference voltage source VDD by the turned-on transistors T4 and T5 of the shift registering unit $2_2$, eliminating the overshoot wave W1/W2.

Similarly, the shift registering units $2_3$ and $2_4$ also perform the above operations. The pull-down circuit 22 of the shift registering unit $2_4$ performs pull-down operations to the output terminal $TO_3$ and the node N30 of the shift registering unit $2_4$, eliminating the overshoot wave induced by the coupling effect of the capacitors C1 and C2 of the shift registering unit $2_3$. The shift registering units $2_5$ and $2_6$ also perform the above operations. The pull-down circuit 22 of the shift registering unit $2_6$ performs pull-down operations to the output terminal $TO_5$ and the node N30 of the shift registering unit $2_5$, eliminating the overshoot wave induced by the coupling effect of the capacitors C1 and C2 of the shift registering unit $2_5$.

Assume that the pull-down circuits 22 of the odd-stage shift registering units $2_1$, $2_3$, and $2_{55}$ perform pull-down operations according to the clock signal CK2, while the pull-down circuits 22 of the odd-stage shift registering units $2_2$, $2_4$, and $2_6$ do not perform pull-down operations according to the clock signal XCK2. The shift registering units $2_1$-$2_6$ perform the above operations, so that pull-down operations to the shift registering units $2_2$ and $2_4$ is performed respectively by the pull-down circuit 22 of the shift registering units $2_3$ and $2_5$. In detail, the pull-down circuit 22 of the shift registering unit $2_3$ performs pull-down operations to the output terminal $TO_2$ of the shift registering unit $2_2$ and the node N30 of the shift registering unit $2_3$, eliminating the overshoot wave induced by the coupling effect of the capacitors C1 and C2 of the shift registering unit $2_2$. The pull-down circuit 22 of the shift registering unit $2_5$ performs pull-down operations to the output terminal $TO_4$ of the shift registering unit $2_4$ and the node N30 of the shift registering unit $2_5$, eliminating the overshoot wave induced by the coupling effect of the capacitors C1 and C2 of the shift registering unit $2_4$. In the embodiment, an external circuit is used to perform pull-down operations to the output terminal $TO_6$ of the last-stage shift registering unit $2_6$.

As described above, each shift registering unit comprises only one pull-down circuit, and the odd-stage shift registering units and the even-stage shift registering units alternately perform pull-down operations. A pull-down operation which is being performed by the pull-down circuit of one shift registering unit is further used for the output terminal of a previous shift registering unit with a pull-down circuit that is not performing the pull-down operation. Thus, in the embodiment, each shift registering unit comprises only one pull-down circuit and can generate a stable output signal. The shift registering unit comprising only one pull-down circuit uses a lesser amount of thin film transistors, thus decreasing power consumption.

In some embodiments, since the transistors T4 and T5 of the pull-down circuit of each shift registering unit need to perform pull-down operations to the current shift registering unit and the previous shift registering unit, the sizes of the transistors T4 and T5 can be designed as 8/100~10/100 of the size of the transistor T2. Assume that the width/length (W/L) ratio of the transistor T2 is 5000 um/5.5 um. The width/length (W/L) ratios of the transistors T4 and T5 are designed as 400 um/505 um~500 um/5.5 um. Thus, it is ensured that the transistors T4 and T5 will have a sufficient amount of ability to perform pull-down operations to the current shift registering unit and the previous shift registering unit. In the embodiments, even though the transistors T4 and T5 are designed to have larger sizes, the entire layout area of the shift register can be reduced due to the decreased amount of transistors in each shift registering unit.

In other some embodiments, the high level of the clock signals CK and CK2 can rise to a higher voltage level, for example, the high level of the clock signals CK and CK2 originally at 25V can rise to 27V. Thus, for one shift registering unit, when the transistors T4 and T5 are turned on according to the clock signal CK2/XCK2 with the high level in time period excluding the period between the time points T2-T4, the gate-source voltages of the transistors T4 and T5 are increased, and the gate currents of the transistors T4 and T5 are also increased, so that the transistors T4 and T5 have a sufficient amount of ability to perform the pull-down operation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift register comprising:
   a first shift registering unit for generating a first trigger signal at a first output terminal, wherein the first shift registering unit comprises a first pull-down circuit; and
   a second shift registering unit for receiving the first trigger signal and generating a second trigger signal at a second output terminal, wherein the first trigger signal and the second trigger signal are sequentially asserted, and the second shift registering unit comprises a second pull-down circuit;
   wherein the first pull-down circuit and the second pull-down circuit perform pull-down operations at different times;
   wherein when the first pull-down circuit does not perform the pull-down operation, the second pull-down circuit performs pull-down operations to the first output terminal;
   wherein each of the first and second shift registering units comprises:
      a pull-up control circuit; and
      a pull-up circuit, coupled to the pull-up control circuit at a first node and controlled by the pull-up control circuit, for receiving a first clock signal and generating an output signal;
      wherein the pull-up circuit of the first shift registering unit generates the corresponding output signal at the first output terminal to serve as the first trigger signal, and the pull-up control circuit of the second shift registering unit receives the first trigger signal; and
   wherein for the first and second shift registering units, each of the first and second pull-down circuits comprises:
      a first transistor having a control terminal and an input terminal both receiving a second clock signal and an output terminal;
      a second transistor having a control terminal coupled to the output terminal of the first transistor, an input terminal coupled to the corresponding first node, and an output terminal coupled to the corresponding first or second output terminal;
      a third transistor having a control terminal coupled to the output terminal of the first transistor, an input terminal coupled to the corresponding first or second output terminal, an output terminal coupled to a reference voltage source; and
      a fourth transistor having a control terminal coupled to the corresponding first node, an input terminal coupled to the output terminal of the first transistor, and an output terminal coupled to the reference voltage source, wherein a size of the fourth transistor is larger than a size of the first transistor.

2. The shift register as claimed in claim 1, wherein when the first pull-down circuit does not perform the pull-down operation, the second pull-down circuit performs pull-down operations to the second output terminal.

3. The shift register as claimed in claim 1, wherein the first pull-down circuit is controlled by a first clock signal, and the second pull-down circuit is controlled by a second clock signal which is inverse to the first clock signal.

4. The shift register as claimed in claim 1, wherein the first clock signal received by the pull-up circuit of the first shift registering unit is inverse to the first clock signal received by the pull-up circuit of the second shift registering unit.

5. The shift register as claimed in claim 1, wherein when the first pull-down circuit does not perform the pull-down operation, the second pull-down circuit performs pull-down operations to the first output terminal through the pull-up control circuit of the second shift registering unit.

6. The shift register as claimed in claim 1, wherein the second clock signal received by the first pull-down circuit is inverse to the second clock signal received by the second pull-down circuit.

7. The shift register as claimed in claim 1, wherein a frequency of the first clock signal is larger than a frequency of the second clock signal.

8. The shift register as claimed in claim 1, wherein for each of the first and second shift registering units, the corresponding pull-up control circuit comprises:
   a fifth transistor having a control terminal, an input terminal, and an output terminal which is coupled to the corresponding first node;
   wherein the control terminal and the input terminal of the fifth transistor of the first shift registering unit receives an externally-inputted signal; and
   wherein the control terminal and the input terminal of the fifth transistor of the second shift registering unit receives the trigger signal.

9. The shift register as claimed in claim 1, wherein for each of the first and second shift registering units, the corresponding pull-up circuit comprises:
   a fifth transistor having a control terminal coupled to the corresponding first node, an input terminal receiving the first clock signal, and an output terminal coupled to the corresponding first or second output terminal.

10. The shift register as claimed in claim 1, wherein the pull-up circuit of the second shift registering unit generates the corresponding output signal at the second output terminal to serve as the second trigger signal.

11. The shift register as claimed in claim 9, wherein a size of the fifth transistor is larger than that of the second and third transistors.

12. A shift register consisting of:
   a first shift registering unit for generating a first trigger signal at a first output terminal, wherein the first shift registering unit comprises a first pull-down circuit; and
   a second shift registering unit for receiving the first trigger signal and generating a second trigger signal at a second output terminal, wherein the first trigger signal and the second trigger signal are sequentially asserted, and the second shift registering unit comprises a second pull-down circuit;

wherein the first pull-down circuit and the second pull-down circuit perform pull-down operations at different times;

wherein when the first pull-down circuit does not perform the pull-down operation, the second pull-down circuit performs pull-down operations to the first output terminal;

wherein each of the first and second shift registering units comprises:
a pull-up control circuit; and
a pull-up circuit, coupled to the pull-up control circuit at a first node and controlled by the pull-up control circuit, for receiving a first clock signal and generating an output signal;
wherein the pull-up circuit of the first shift registering unit generates the corresponding output signal at the first output terminal to serve as the first trigger signal, and the pull-up control circuit of the second shift registering unit receives the first trigger signal; and wherein for the first and second shift registering units, each of the first and second pull-down circuits comprises:
a first transistor having a control terminal and an input terminal both receiving a second clock signal and an output terminal;
a second transistor having a control terminal coupled to the output terminal of the first transistor, an input terminal coupled to the corresponding first node, and an output terminal coupled to the corresponding first or second output terminal;
a third transistor having a control terminal coupled to the output terminal of the first transistor, an input terminal coupled to the corresponding first or second output terminal, an output terminal coupled to a reference voltage source; and
a fourth transistor having a control terminal coupled to the corresponding first node, an input terminal coupled to the output terminal of the first transistor, and an output terminal coupled to the reference voltage source.

13. The shift register as claimed in claim 12, wherein when the first pull-down circuit does not perform the pull-down operation, the second pull-down circuit performs pull-down operations to the second output terminal.

14. The shift register as claimed in claim 12, wherein the first pull-down circuit is controlled by a first clock signal, and the second pull-down circuit is controlled by a second clock signal which is inverse to the first clock signal.

15. The shift register as claimed in claim 12, wherein a frequency of the first clock signal is larger than a frequency of the second clock signal.

16. The shift register as claimed in claim 12, wherein for each of the first and second shift registering units, the corresponding pull-up control circuit comprises:
a fifth transistor having a control terminal, an input terminal, and an output terminal which is coupled to the corresponding first node;
wherein the control terminal and the input terminal of the fifth transistor of the first shift registering unit receives an externally-inputted signal; and
wherein the control terminal and the input terminal of the fifth transistor of the second shift registering unit receives the trigger signal.

17. The shift register as claimed in claim 12, wherein for each of the first and second shift registering units, the corresponding pull-up circuit comprises:
a fifth transistor having a control terminal coupled to the corresponding first node, an input terminal receiving the first clock signal, and an output terminal coupled to the corresponding first or second output terminal.

18. The shift register as claimed in claim 12, wherein the pull-up circuit of the second shift registering unit generates the corresponding output signal at the second output terminal to serve as the second trigger signal.

19. A shift register comprising:
a first shift registering unit for generating a first trigger signal at a first output terminal, wherein the first shift registering unit comprises a first pull-down circuit; and
a second shift registering unit for receiving the first trigger signal and generating a second trigger signal at a second output terminal, wherein the first trigger signal and the second trigger signal are sequentially asserted, and the second shift registering unit comprises a second pull-down circuit;

wherein the first pull-down circuit and the second pull-down circuit perform pull-down operations at different times;

wherein when the first pull-down circuit does not perform the pull-down operation, the second pull-down circuit performs pull-down operations to the first output terminal;

wherein each of the first and second shift registering units comprises:
a pull-up control circuit; and
a pull-up circuit, coupled to the pull-up control circuit at a first node and controlled by the pull-up control circuit, for receiving a first clock signal and generating an output signal;
wherein the pull-up circuit of the first shift registering unit generates the corresponding output signal at the first output terminal to serve as the first trigger signal, and the pull-up control circuit of the second shift registering unit receives the first trigger signal; and wherein for the first and second shift registering units, each of the first and second pull-down circuits comprises:
a first transistor having a control terminal and an input terminal both receiving a second clock signal and an output terminal;
a second transistor having a control terminal coupled to the output terminal of the first transistor, an input terminal coupled to the corresponding first node, and an output terminal coupled to the corresponding first or second output terminal;
a third transistor having a control terminal coupled to the output terminal of the first transistor, an input terminal coupled to the corresponding first or second output terminal, an output terminal coupled to a reference voltage source; and
a fourth transistor having a control terminal coupled to the corresponding first node, an input terminal coupled to the output terminal of the first transistor, and an output terminal coupled to the reference voltage source; and wherein for each of the first and second shift registering units, the corresponding pull-up circuit comprises:
a fifth transistor having a control terminal coupled to the corresponding first node, an input terminal receiving the first clock signal, and an output terminal coupled to the corresponding first or second output terminal, wherein a size of the fifth transistor is larger than that of the second and third transistors.

20. The shift register as claimed in claim 19, wherein the first pull-down circuit is controlled by a first clock signal, and the second pull-down circuit is controlled by a second clock signal which is inverse to the first clock signal.

* * * * *